United States Patent
Kim et al.

(10) Patent No.: US 9,711,389 B2
(45) Date of Patent: Jul. 18, 2017

(54) AUTOMATIC MODULE APPARATUS FOR MANUFACTURING SOLID STATE DRIVES (SSD)

(71) Applicant: Samsung Electronics Co., Ltd., Suwon-si (KR)

(72) Inventors: Min-woo Kim, Cheonan-si (KR); Dong-woo Shin, Cheonan-si (KR); Il-hyoung Koo, Asan-si (KR); Do-young Jung, Asan-si (KR)

(73) Assignee: Samsung Electronics Co., Ltd. (KR)

( * ) Notice: Subject to any disclaimer, the term of this patent is extended or adjusted under 35 U.S.C. 154(b) by 83 days.

(21) Appl. No.: 14/465,364

(22) Filed: Aug. 21, 2014

(65) Prior Publication Data

US 2015/0077153 A1   Mar. 19, 2015

(30) Foreign Application Priority Data

Sep. 17, 2013   (KR) .................. 10-2013-0111937

(51) Int. Cl.

| H01L 21/67 | (2006.01) |
|---|---|
| H01L 21/687 | (2006.01) |
| G01R 31/28 | (2006.01) |
| G11C 29/56 | (2006.01) |
| G11C 16/00 | (2006.01) |

(52) U.S. Cl.
CPC .... *H01L 21/68707* (2013.01); *G01R 31/2893* (2013.01); *G11C 29/56016* (2013.01); *H01L 21/67271* (2013.01); *H01L 21/67294* (2013.01); *G11C 16/00* (2013.01)

(58) Field of Classification Search
None
See application file for complete search history.

(56) References Cited

U.S. PATENT DOCUMENTS

| 5,313,156 | A | * | 5/1994 | Klug | ................. | G01R 31/2893 209/573 |
|---|---|---|---|---|---|---|
| 6,313,652 | B1 | * | 11/2001 | Maeng | ................ | G01R 1/0408 209/574 |
| 6,346,682 | B2 | | 2/2002 | Kim et al. | | |
| 7,408,338 | B2 | | 8/2008 | Ham et al. | | |

(Continued)

FOREIGN PATENT DOCUMENTS

| KR | 10-2006-0022350 A | 3/2006 |
|---|---|---|
| KR | 10-2008-0097516 A | 11/2008 |

(Continued)

*Primary Examiner* — Jermele M Hollington
*Assistant Examiner* — Douglas X Rodriguez
(74) *Attorney, Agent, or Firm* — Myers Bigel, P.A.

(57) ABSTRACT

An automatic module apparatus for manufacturing a solid state drive (SSD) includes a labeling apparatus, one or more test handler apparatuses and a sorting apparatus. The labeling apparatus is for printing a label on a SSD mounted on a carrier tray. The one or more test handler apparatuses are for transporting the carrier tray on which the labeled SSD is mounted and for testing the labeled SSDs to determine whether the labeled SSDs have any defects. The SSD sorting apparatus is for transporting the carrier tray on which the tested SSDs are mounted and sorting non-defective defective SSDs tested by the test handler apparatuses. The SSD labeling apparatus, the test handler apparatuses, and the SSD sorting apparatus are in-line and automated.

20 Claims, 16 Drawing Sheets

(56) References Cited

U.S. PATENT DOCUMENTS

| | | |
|---|---|---|
| 8,305,103 B2 | 11/2012 | Kang et al. |
| 2002/0025603 A1* | 2/2002 | Ondricek ............. G01R 1/0408 438/117 |
| 2004/0181961 A1 | 9/2004 | Hwang et al. |
| 2008/0110555 A1* | 5/2008 | Bouchelle ................. B65C 3/16 156/230 |
| 2010/0218050 A1* | 8/2010 | Co ................... G11C 29/56016 714/42 |
| 2012/0062262 A1 | 3/2012 | Lee |

FOREIGN PATENT DOCUMENTS

| | | |
|---|---|---|
| KR | 10-2009-0038235 A | 4/2009 |
| KR | 10-2009-0085453 A | 8/2009 |
| KR | 10-2009-0128025 A | 12/2009 |
| KR | 10-2010-0028876 A | 3/2010 |
| KR | 10-2010-0105973 A | 10/2010 |
| KR | 10-2011-0029869 A | 3/2011 |
| KR | 10-2012-0122540 A | 11/2012 |

* cited by examiner

AUTOMATIC MODULE APPARATUS FOR MANUFACTURING SOLID STATE DRIVES (SSD)

CROSS-REFERENCE TO RELATED APPLICATIONS

This application claims the benefit of Korean Patent Application No. 10-2013-0111937, filed on Sep. 17, 2013, in the Korean Intellectual Property Office, the disclosure of which is incorporated by reference herein in its entirety.

FIELD

The inventive concept relates to an automatic module apparatus for manufacturing solid state drives (SSDs), and more particularly, to an automatic module apparatus for manufacturing SSDs including test handler apparatuses.

BACKGROUND

SSDs may be used instead of a hard disk used in a computer or a mini hard disk used in a portable device. The SSDs use devices such as flash memories, and store data so that the SSDs may implement programs quickly, and shorten a boot time compared to a hard disk when the SSDs are used as a booting disk. Before shipping the SSDs, they should be tested to distinguish defective SSDs (e.g., rejects) from non-defective SSDs.

SUMMARY

The inventive concept provides an automatic module apparatus for manufacturing solid state drives (SSDs) including test handler apparatuses for testing and determining defective and non-defective SSDs.

According to one aspect of the inventive concept, there is provided an automatic module apparatus for manufacturing a solid state drive (SSD), the apparatus including: a SSD labeling apparatus configured to print a label on each of a plurality of SSDs mounted on a carrier tray; one or more test handler apparatuses; and a first SSD sorting apparatus. Each test handler apparatus is configured to receive the carrier tray on which the labeled SSDs are mounted from the SSD labeling apparatus and to test the labeled SSDs to determine whether the labeled SSDs are defective or non-defective. The first SSD sorting apparatus is configured to receive the carrier tray on which the tested SSDs are mounted and to sort non-defective defective SSDs as tested by the test handler apparatuses. The SSD labeling apparatus, the test handler apparatuses, and the SSD sorting apparatus are in-line with the SSD labeling apparatus in front of the of the test handler apparatuses and the test handler apparatuses in front of the first SSD sorting apparatus. The SSD labeling apparatus, the test handler apparatuses, and the first SSD sorting apparatus are automated such that the carrier tray is transported from the SSD labeling apparatus to the test handler apparatuses and from the test handler apparatuses to the first SSD sorting apparatus.

The carrier tray may be transported by a tray transportation apparatus installed in the SSD labeling apparatus, the test handler apparatuses, and the first SSD sorting apparatus. At least one tray rotation member configured to rotate the carrier tray may be installed in the tray transportation apparatus.

A SSD casing apparatus configured to assemble cases on each of the SSDs mounted on the carrier tray may be further installed in front of the SSD labeling apparatus. A second SSD sorting apparatus configured to sort defective bare SSDs from non-defective bare SSDs manufactured by a router apparatus may be further installed in front of the SSD casing apparatus.

A visual inspection apparatus configured to inspect an exterior of each of the SSDs mounted on the carrier tray may be further installed with the first SSD sorting apparatus in front of the visual inspection apparatus.

A visual inspection apparatus disposed between the test handler apparatuses and the first SSD sorting apparatus configured to inspect an exterior of each of the SSDs mounted on the carrier tray may be further installed.

According to another aspect of the inventive concept, there is provided an automatic module apparatus for manufacturing a SSD, the apparatus including: a tray loading apparatus configured to provide a carrier tray on which a plurality of SSDs are mounted; a tray transportation apparatus configured to receive and to transport the carrier tray on which the SSDs are mounted; and one or more test handler apparatuses configured to test electrical characteristics of the SSDs mounted on the carrier tray. The tray transportation apparatus extends through each of the test handler apparatuses. Each test handler apparatus includes: a test kit stack part configured to receive the SSDs from the carrier tray such that each SSD is mounted on a test kit on the test kit stack part; and a test site unit configured to receive the test kits from the test kit stack part and to test electrical characteristics of the SSDs mounted on test kits.

The test kit stack part may include a plurality of test kit stack units capable of stacking different test kits. A plurality of the test kits may be mounted on each of the test kit stack units in a stacked relationship to one another.

A transportation robot may be configured to transport the test kits from the test kit stack units to the test site unit.

Each test handler apparatus may include a transportation robot configured to transport the SSDs from the carrier tray, and to transport the test kits to the test site unit.

The transportation robot may include: a picker configured to mount the SSDs on respective test kits; and a gripper configured to transport the test kits to the test site unit.

The test site unit may include: a test kit fixing support on which the test kits are fixedly mounted; and a test board configured to electrically connect to the SSDs mounted on the test kits.

Each test kit may include one or more protrusions at a bottom portion thereof, and the test kit fixing support may include one or more grooves sized and configured to receive the one or more protrusions such that the test kit is fixedly mounted to the test kit fixing support.

A plurality of unit socket groups for electrical connection with the SSDs mounted on the test kits may be installed on the test board. Each unit socket group may include a plurality of differently configured sockets for electrical connection with a plurality of differently configured SSDs.

According to another aspect of the inventive concept, there is provided an automatic module apparatus for manufacturing a SSD, the apparatus including: a tray transportation apparatus configured to transport a carrier tray on which a plurality of SSDs are mounted; and a test handler apparatus through which the tray transportation apparatus extends. The test handler apparatus includes: a test kit stack part having a plurality of test kits thereon; a test site unit having a plurality of sockets, each socket configured to electrically connect with an SSD; and least one transportation robot configured to: remove each SSD from the carrier tray and mount the SSD on one of the test kits on the test kit stack part; and transport each test kit with the SSD mounted thereon to the test site unit.

The test site unit may include a test kit fixing support, and the at least one transportation robot may be configured to mount the test kits to the test kit fixing support.

Each test kit may include a protrusion at a bottom portion thereof, and the test kit fixing support may include a groove having a wide portion and a narrow portion. The at least one transportation robot may be configured to mount the test kit to the test kit fixing support such that the protrusion is first received in the wide portion of the groove and then received in the narrow portion of the groove to fixedly mount the test kit to the test kit fixing support.

The test kit fixing support may be configured to move toward the sockets such that a connector of one of the SSDs is received in one of the sockets to electrically connect the SSD and the socket.

The test handler apparatus may be configured to determine whether each SSD is defective or non-defective based on an electrical test. The at least one transportation robot may be configured to transport the SSDs that are determined to be non-defective to the carrier tray. The tray transportation apparatus may be configured to transport the carrier tray having the non-defective SSDs away from the test handler apparatus.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
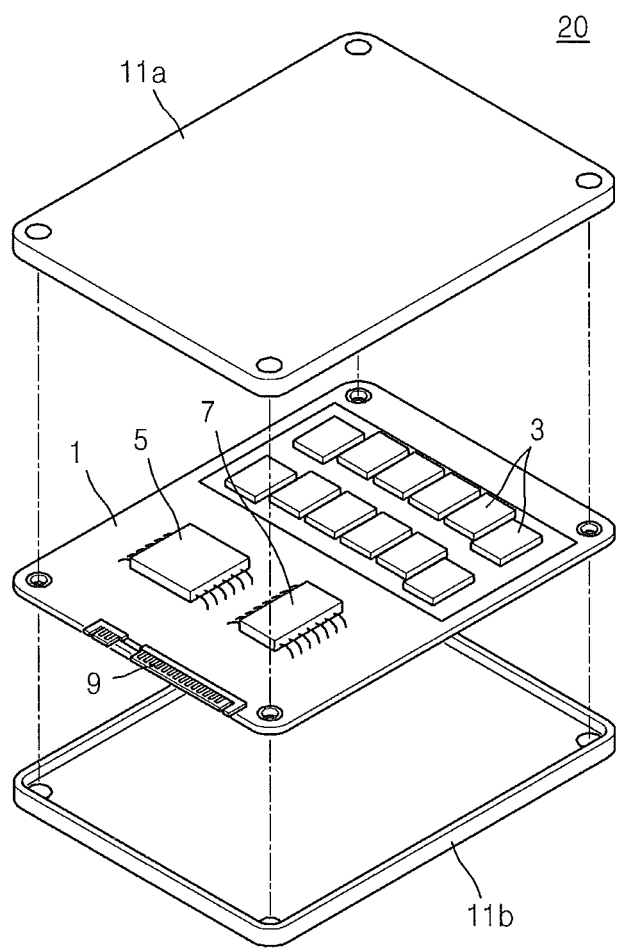
FIG. 1 is an exploded perspective view of a solid state drive (SSD) that may be used in an automatic module apparatus for manufacturing SSDs, according to an embodiment of the inventive concept.

Hereinafter, the inventive concept now will be described more fully hereinafter with reference to the accompanying drawings, in which illustrative embodiments of the inventive concept are shown. This inventive concept may, however, be embodied in many different forms and should not be construed as limited to the embodiments set forth herein; rather, these embodiments are provided so that this disclosure will be thorough and complete, and will fully convey the scope of the inventive concept to those of ordinary skill in the art.

It will be understood that when an element is "connected" to another element, the element can be directly connected to the other element, but there may also be an intervening element therebetween. Similarly, when an element is "on" another element, the element can be directly on the other element, or on an intervening element. Furthermore, structures and sizes of elements in the drawings may be exaggerated for convenience and clarity of explanation, and parts that are not related to the explanation are omitted. Like numbers refer to like elements throughout.

In addition, spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is an exploded perspective view of a solid state drive (SSD) 20 that may be used in an automatic module apparatus for manufacturing SSDs, according to an embodiment of the inventive concept.

In more detail, FIG. 1 is an embodiment of the SSD 20. The inventive concept is not limited to the SSD 20 illustrated in FIG. 1, and other SSDs may have various forms and sizes, and include different components. The SSD 20 may include a printed circuit board (PCB) 1, a plurality of flash memories 3, a main controller 5, an input/output controller 7, and a connector 9. The controller 5 and the input/output controller 7 may be included in a single semiconductor chip.

The flash memories 3, the main controller 5, the input/output controller 7, and the connector 9 may be mounted on the PCB 1. Each component of the SSD 20 may be mounted on a surface of the PCB 1. Also, according to a storage capacity of the SSD 20, the controller 5, and the input/output controller 7 may be mounted on one surface of the PCB 1, and the flash memories 3 for storing data may be mounted on another surface (e.g., the opposite surface).

The main controller 5 may control the SSD 20 generally, and the input/output controller 7 may control an input and an output of data that is input or output through the connector 9. The flash memories 3 may store the data input by the input/output controller 7, and output the data to be output through the input/output controller 7, under the control of the main controller 5. The input/output controller 7 controls the input or output data to send it to or receive it from the connector 9. The connector 9 that inputs or outputs the data includes a plurality of pins so that the connector 9 may be connected to an input/output terminal of a computer or a portable device.

A condition in which only the above-described components are mounted on the PCB 1 may be referred to as a bare SSD. Cases 11a and 11b may be assembled to protect the bare SSD. In other words, the cases 11a and 11b may be assembled to protect each component mounted on the PCB 1.

The case 11a may be assembled at the top of the PCB 1 and protect respective components mounted thereon. Furthermore, the case 11b may be assembled at the bottom of the PCB 1 and protect the respective components mounted thereon or the PCB 1 itself. Hereinafter, the reference numeral of both the bare SSD and the SSD on which cases 11a and 11b are assembled is 20 for convenience of explanation.

Figure 2:
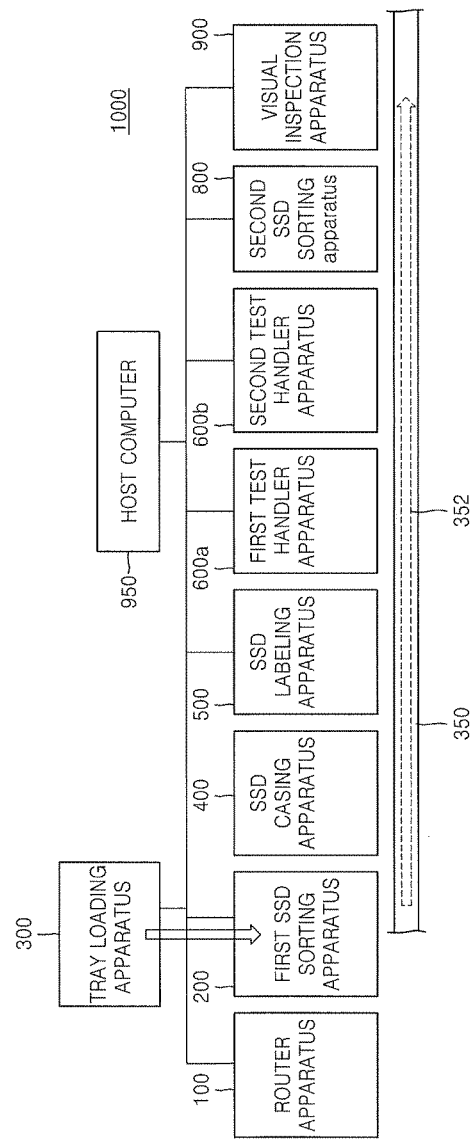
FIG. 2 is a schematic view illustrating an automatic module apparatus for manufacturing SSDs, according to an embodiment of the inventive concept.
Figure 3:
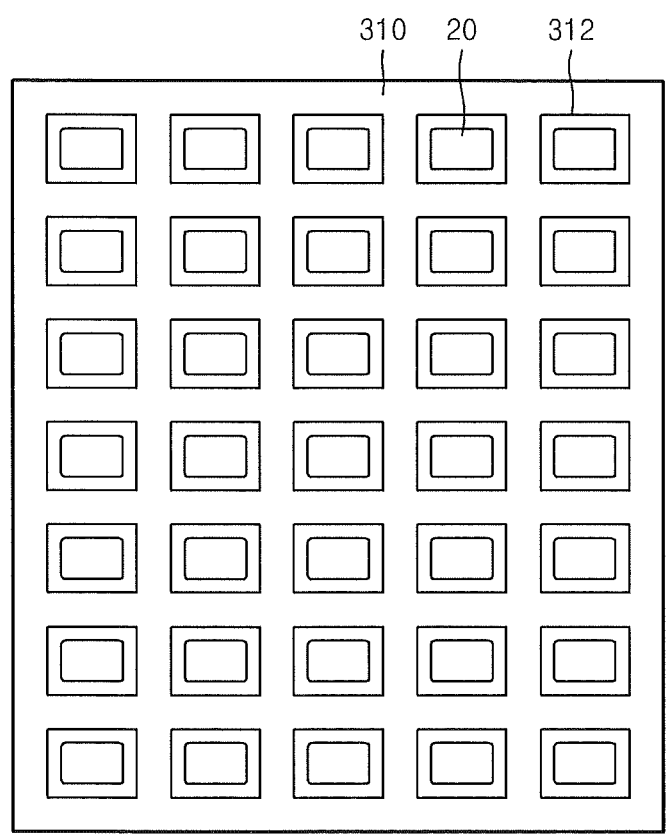
FIG. 3 is a plan view of a carrier tray used in an automatic module apparatus for manufacturing SSDs, according to an embodiment of the inventive concept.

FIG. 2 is a schematic view illustrating an automatic module apparatus 1000 for manufacturing the SSDs 20 including test handler apparatuses 600a and 600b, according to an embodiment of the inventive concept, and FIG. 3 is a plan view of a carrier tray 310 used in the automatic module apparatus 1000 for manufacturing the SSDs 20, according to an embodiment of the inventive concept.

In more detail, FIG. 2 illustrates an embodiment of an arrangement of each manufacturing apparatus forming the automatic module apparatus 1000 for manufacturing the SSDs 20. Each of the manufacturing apparatuses forming the automatic module apparatus 1000 for manufacturing the SSDs 20 may be controlled by one or more host computers 950. For convenience, each of the host computers 950 that respectively controls the manufacturing apparatuses forming the automatic module apparatus 1000 for manufacturing the SSDs 20 is not shown.

FIG. 3 is an embodiment of the carrier tray 310 that may be used in the automatic module apparatus 1000 of FIG. 2 for manufacturing the SSDs 20. The automatic module apparatus 1000 for manufacturing the SSDs 20 may be in-line in a SSD manufacturing plant when the carrier tray 310 illustrated in FIG. 3 is transported from left to right by using a transportation apparatus 350, for example, a conveyor rail.

In the present embodiment, the automatic module apparatus 1000 for manufacturing the SSDs 20 may be automated by connecting all manufacturing apparatuses in the manufacturing plant in an in-line manner. Some of the manufacturing apparatuses forming the automatic module apparatus 1000 for manufacturing the SSDs 20 illustrated in FIG. 2 are in-line and automated, but the other manufacturing apparatuses may be not be in-line (e.g., off-line) and may not be automated.

For example, a SSD labelling apparatus 500, test handler apparatuses 600a and 600b, and a second SSD sorting apparatus 800 may be in-line and automated. On the other hand, a router apparatus 100, a first SSD sorting apparatus 200, a SSD casing apparatus 400, and a visual inspection apparatus 900 may be off-line and not automated.

The automatic module apparatus 1000 for manufacturing the SSDs 20 includes the test handler apparatuses 600a and 600b for testing electric or electrical characteristics of the SSDs 20. In FIG. 2, there are two test handler apparatuses 600a and 600b, but more than two test handler apparatuses may be used.

A configuration of the automatic module apparatus 1000 for manufacturing the SSDs 20 including the test handler apparatuses 600a and 600b, and a procedure of manufacturing the SSDs 20 by using the automatic module apparatus 1000 will be described with reference to FIGS. 2 and 3.

The router apparatus 100 separates a plurality of bare SSDs 20 into respective bare SSDs formed on the PCB 1. The SSD 20 illustrated in FIG. 1 shows one SSD.

The first SSD sorting apparatus 200 sorts defective bare SSDs from non-defective SSDs manufactured or separated in the router apparatus 100. The first SSD sorting apparatus 200 may load the carrier tray 310 via a tray loading apparatus 300 as illustrated in FIGS. 2 and 3. Therefore, the first SSD sorting apparatus 200 distinguishes the defective bare SSDs 20 (e.g., rejects) from the non-defective bare SSDs 20 manufactured or separated in the router apparatus 100, and loads or mounts the non-defective bare SSDs 20 on the carrier tray 310.

As shown in FIG. 3, the carrier tray 310 may have housing units 312 capable of holding or housing the bare SSDs 20. In FIG. 3, there are thirty-five housing units 312 for convenience of explanation, but the number of housing units 312 is not limited thereto. FIG. 3 illustrates the carrier tray 310 on which thirty-five bare SSDs 20 with no defects are mounted.

The carrier tray 310 on which the bare SSDs 20 are mounted may be transported to the SSD casing apparatus 400 by the tray transportation apparatus 350. The SSD casing apparatus 400 is an apparatus for assembling the cases 11a and 11b of FIG. 1 at the top and bottom of the bare SSDs 20. In the SSD casing apparatus 400, after transporting the bare SSD 20 mounted on the carrier tray 310 to a casing unit in order to assemble cases 11a and 11b, the SSDs 20 assembled with the cases 11a and 11b of FIG. 1 may be transported to the carrier tray 310 again.

The carrier tray 310 having the SSDs 20 assembled with the cases 11a and 11b may be transported to the SSD labelling apparatus 500 by the tray transportation apparatus 350. The SSD labelling apparatus 500 is an apparatus for printing a label including, for example, a brand name, a serial number, a product name, a lot number, etc. on the top or bottom cases 11a and 11b of FIG. 1 of the SSD 20, or on the PCB 1. The SSD labelling apparatus 500 transports the SSD 20 mounted on the carrier tray 310 to a labelling unit to proceed with a labelling process, and then transports the labelled SSD 20 to the carrier tray 310 again.

The carrier tray 310 on which the labelled SSD 20 is mounted may be transported to the test handler apparatuses 600a and 600b by the tray transportation apparatus 350. The test handler apparatuses 600a and 600b test electric or electrical characteristics of the SSDs 20. In addition, the test handler apparatuses 600a and 600b test the SSDs 20 by transporting the SSDs 20 mounted on the carrier tray 310 to test site units 630a and 630b (FIG. 5), and transport the SSDs 20 to the carrier tray 310 again. The test site units 630a, 630b may inspect various types of SSDs 20 without replacing a test board 624 associated therewith. The test handler apparatuses 600a and 600b will be further described below.

The carrier tray 310 on which the electrically tested SSDs 20 are mounted may be transported to a second SSD sorting apparatus 800 by the tray transportation apparatus 350. The second SSD sorting apparatus 800 finally sorts the non-defective SSDs from the defective SSDs tested in the test handler apparatuses 600a and 600b. The non-defective SSDs 20 sorted in the second SSD sorting apparatus 800 may be mounted on the carrier tray 310.

The carrier tray 310 on which the non-defective SSDs 20 are mounted may be transported to a visual inspection apparatus 900 by the tray transportation apparatus 350. The visual inspection apparatus 900 finally inspects exterior conditions of the SSDs 20 by using an optical microscope. Also, the visual inspection apparatus 900 transports the SSDs 20 mounted on the carrier tray 310 to a visual inspection unit including an optical microscope, and examines the exterior conditions of the SSDs 20. Then, the non-defective SSDs 20 are transported to the carrier tray 310 again. Non-defective SSDs as determined by the visual inspection apparatus 900 may be prepared for sale through a packaging process, etc.

Each of the manufacturing apparatuses forming the automatic module apparatus 1000 for manufacturing the SSDs according to an embodiment of the inventive concept includes the carrier tray 310 on which the SSDs 20 are mounted and the tray transportation apparatus 350 for transporting the carrier tray 310.

The automatic module apparatus 1000 for manufacturing the SSDs 20 transports the carrier tray 310 before or after a manufacturing procedure by using the tray transportation apparatus 350, and thus the manufacturing apparatuses may be in-line and automated. Since the automatic module apparatus 1000 for manufacturing the SSDs 20 includes some or all of the manufacturing apparatuses that are in-line and automated, a manufacturing time and/or production costs may be decreased, and efficiency in producing non-defective products may be improved.

Also, the automatic module apparatus 1000 for manufacturing the SSDs 20 includes the test handler apparatuses 600a and 600b for testing the electric or electrical characteristics of the SSDs 20. The test handler apparatuses 600a and 600b include a test site having test boards 624 (FIG. 5) for efficiently inspecting various SSDs 20 so that SSD testing costs and time may be saved.

Figure 4:
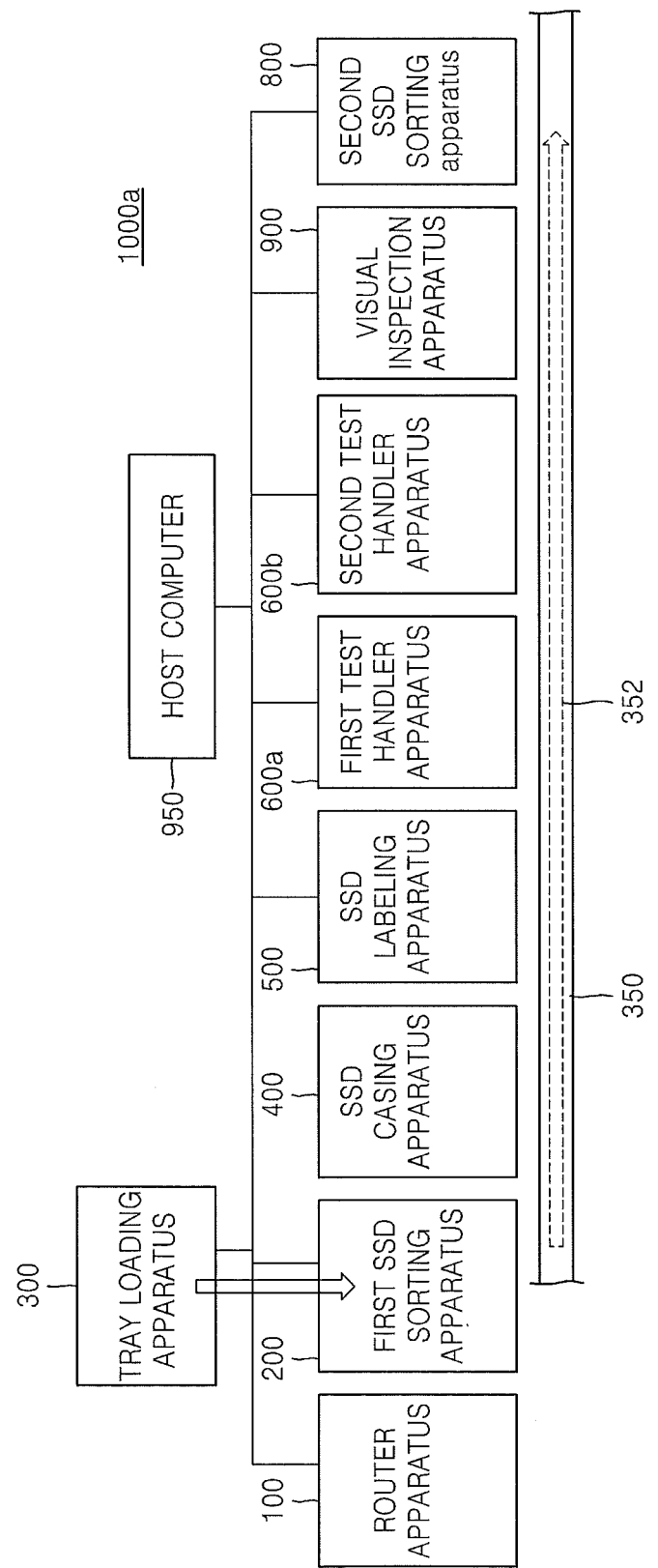
FIG. 4 is a schematic view illustrating an automatic module apparatus for manufacturing SSDs, including test handler apparatuses, according to an embodiment of the inventive concept.

FIG. 4 is a schematic view of the automatic module apparatus 1000a for manufacturing the SSDs 20 including the test handler apparatuses 600a and 600b.

In particular, the automatic module apparatus 1000a for manufacturing the SSDs 20 illustrated in FIG. 4 may have an identical configuration, other than arrangements of the manufacturing apparatuses, when both automatic module apparatuses 1000 and 1000a are compared. The arrangement of each manufacturing apparatus of the automatic module apparatuses 1000, 1000a for manufacturing the SSDs 20 may vary according to necessity or for convenience.

The automatic module apparatus 1000a for manufacturing the SSDs 20 illustrated in FIG. 4 has the test handler apparatus 600b and the visual inspection apparatus 900 adjacent to one another or connected unlike the automatic module apparatus 1000 illustrated in FIG. 2, and the visual inspection apparatus 900 may be arranged by being connected with or adjacent to the second SSD sorting apparatus 800. In this regard, the electrically tested SSDs undergo an exterior examination first in the visual inspection apparatus 900, and, in the second SSD sorting apparatus 800, the SSDs are finally sorted based on whether the SSDs have exterior defects. When the non-defective SSDs pass the exterior examination and are sorted, they may be shipped after the packaging process and other processes are completed.

Figure 5:
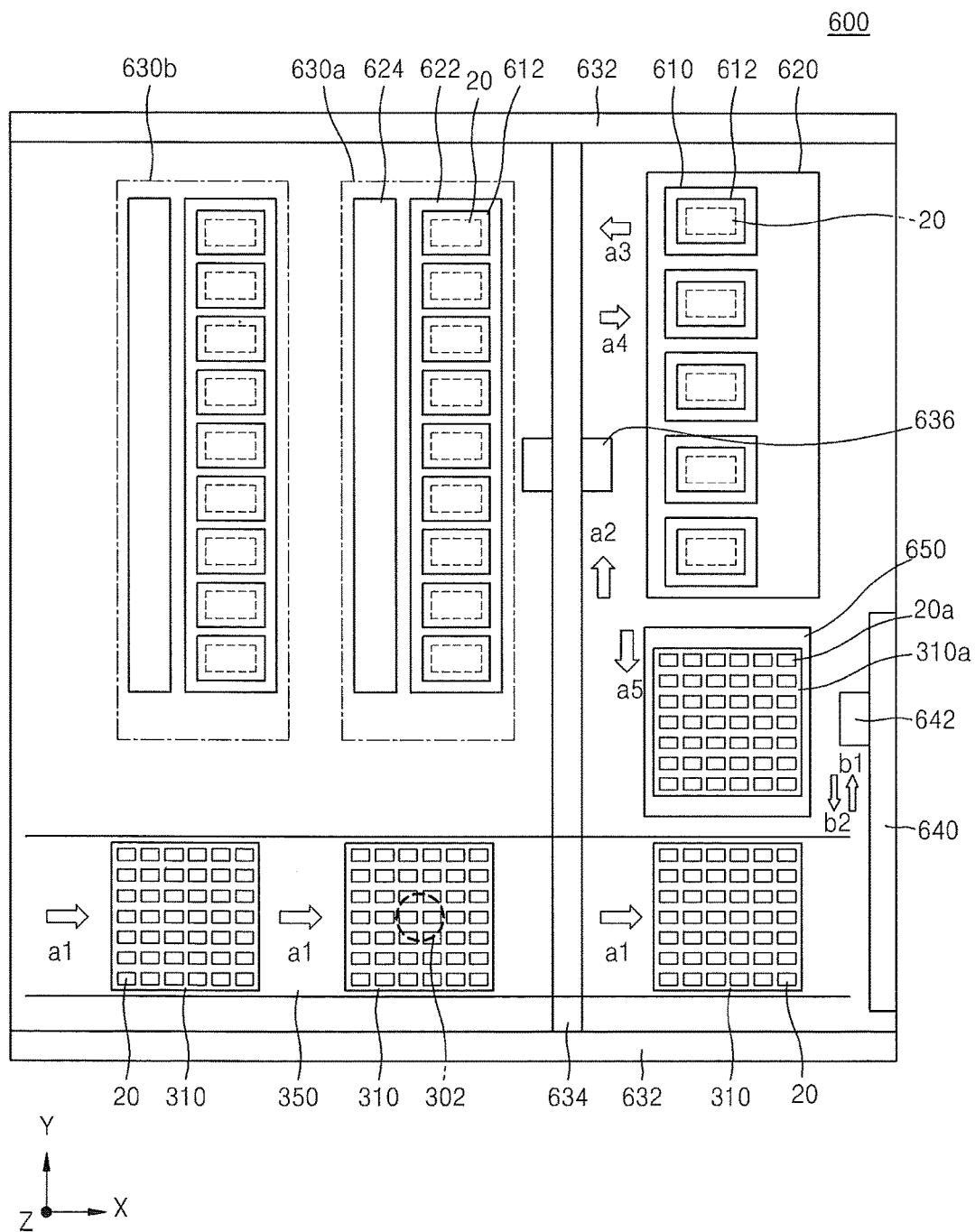
FIG. 5 illustrates test handler apparatuses of an automatic module apparatus for manufacturing SSDs, according to an embodiment of the inventive concept.

FIG. 5 is a plan view of the test handler apparatus 600 of the automatic module apparatus 1000 for manufacturing the SSDs 20, according to an embodiment of the inventive concept.

In more detail, FIG. 5 is a plan view illustrating an embodiment regarding one of the test handler apparatuses 600a and 600b of the automatic module apparatuses 1000 and 1000a for manufacturing the SSDs 20. The test handler apparatus 600 may include a test kit stack member or part 620, test site units 630a and 630b, first transportation robots 632, 634 and 636, second transportation robots 640 and 642, and a supportive carrier tray mounting unit or carrier tray support 650.

From the SSD labelling apparatus 500 of FIG. 2 to a side of the test handler apparatus 600, the carrier tray 310 on which the SSDs 20 are mounted is transported by the tray transportation apparatus 350 in an X axis direction (e.g., in the direction a1 shown in FIG. 5). In the tray transportation apparatus 350, tray rotation members 302 for supporting and rotating the carrier tray 310 may be installed. The tray rotation members 302 may be installed to rotate the carrier tray 310 to match a direction of a connector of the SSD 20 mounted on the carrier tray 310 with that of a socket 654 on the test board 624 that will be described later.

The SSDs 20 mounted on the carrier tray 310 are transported to the test kit stack part 620 by the first transportation robots 632, 634 and 636, in a Y axis direction (e.g., in the direction a2 shown in FIG. 5). A plurality of test kit stack units 610 may be installed in the test kit stack part 620. In FIG. 5, five test kit stack units 610 are installed, but fewer or greater test kit stack units 610 may be provided in other embodiments. Test kits or test kit members 612 may be mounted on test kit stack units 610. The SSDs transported to the test kit stack part 620 may be mounted on the test kits 612. The test kit stack units 610 and the test kits 612 will be further described below.

The test kits 612 on which the SSDs 20 are mounted are transported to the test site units 630a and 630b in a minus X axis direction (e.g., in the direction a3 shown in FIG. 5). In the first transportation robots 632, 634 and 636, the reference numeral 636 denotes a picker and a gripper for transporting both the SSDs 20 and the test kits 612, and the reference numerals 632 and 634 indicate transportation rails for moving the picker and the gripper horizontally or vertically, respectively. In some embodiments, transportation apparatuses for transporting the SSDs and the test kits 612 in a Z axis direction may be installed for moving the picker and the gripper 636.

In the test site units 630a and 630b, the SSDs 20 mounted on the test kits 612 are electrically tested, and are sorted to find whether the SSDs have any defects. The test site units 630a and 630b may include the test board 624, and the test kit fixing support 622. The test board 624 may be a connection board that may be electrically connected with the SSDs 20 mounted on the test kits 612, and the test kit fixing support 622 may be a support for fixing the test kits 612 on which the SSDs 20 are mounted while the SSDs 20 are tested. The test kit fixing support 622 may move in the X axis direction for electrical connection with the test board 624. In addition, the test kit fixing support 622 may move in the Z axis direction perpendicular to the ground so as to match a height of the test kit fixing support 622 with the test board 624. The test site units 630*a* and 630*b* will be described in more detail below.

After testing the SSDs 20, the test kits 612 on which the SSDs 20 are mounted are transported to the test kit stack unit 620 by the first transportation robots 632, 634 and 636 in a direction a4. The SSDs 20 that are electrically tested are transported by the first transportation robots 632, 634 and 636 in a direction a5 and mounted on the carrier tray 310.

In some embodiments, when the SSDs 20 tested in the test site units 630*a* and 630*b* are defective SSDs 20*a*, they may be transported into a supportive carrier tray 310*a* of the supportive carrier tray mounting unit 650 by the first transportation robots 632, 634 and 636. The transported defective SSDs 20*a* may be transported to the test site units 630*a* and 630*b* again in order to retest whether the transported defective SSDs 20*a* are indeed defective.

The supportive carrier tray 310*a* may be mounted on the supportive carrier tray mounting unit 650 by the second transportation robots 640 and 642 in a direction b1. Also, the supportive carrier tray 310*a* of the supportive carrier tray mounting unit 650 may be transported to the tray transportation apparatus 350 by the second transportation robots 640 and 642 in a direction b2.

In the second transportation robots 640 and 642, the reference numeral 642 indicates a gripper for transporting the supportive carrier tray 310*a*, and the reference numeral 640 indicates the transportation rails for moving the gripper 642 in the Y axis direction. In some embodiments, the transportation apparatuses may be installed to move the gripper 640 such that the gripper 640 transports the supportive carrier tray 310*a* in the Z axis direction perpendicular to the ground.

The carrier tray 310 on which the electrically tested SSDs 20 are mounted is transported to a next manufacturing process, for example, to the second SSD sorting apparatus 800 of FIG. 2, or to the visual inspection apparatus 900 of FIG. 4.

Figure 6:
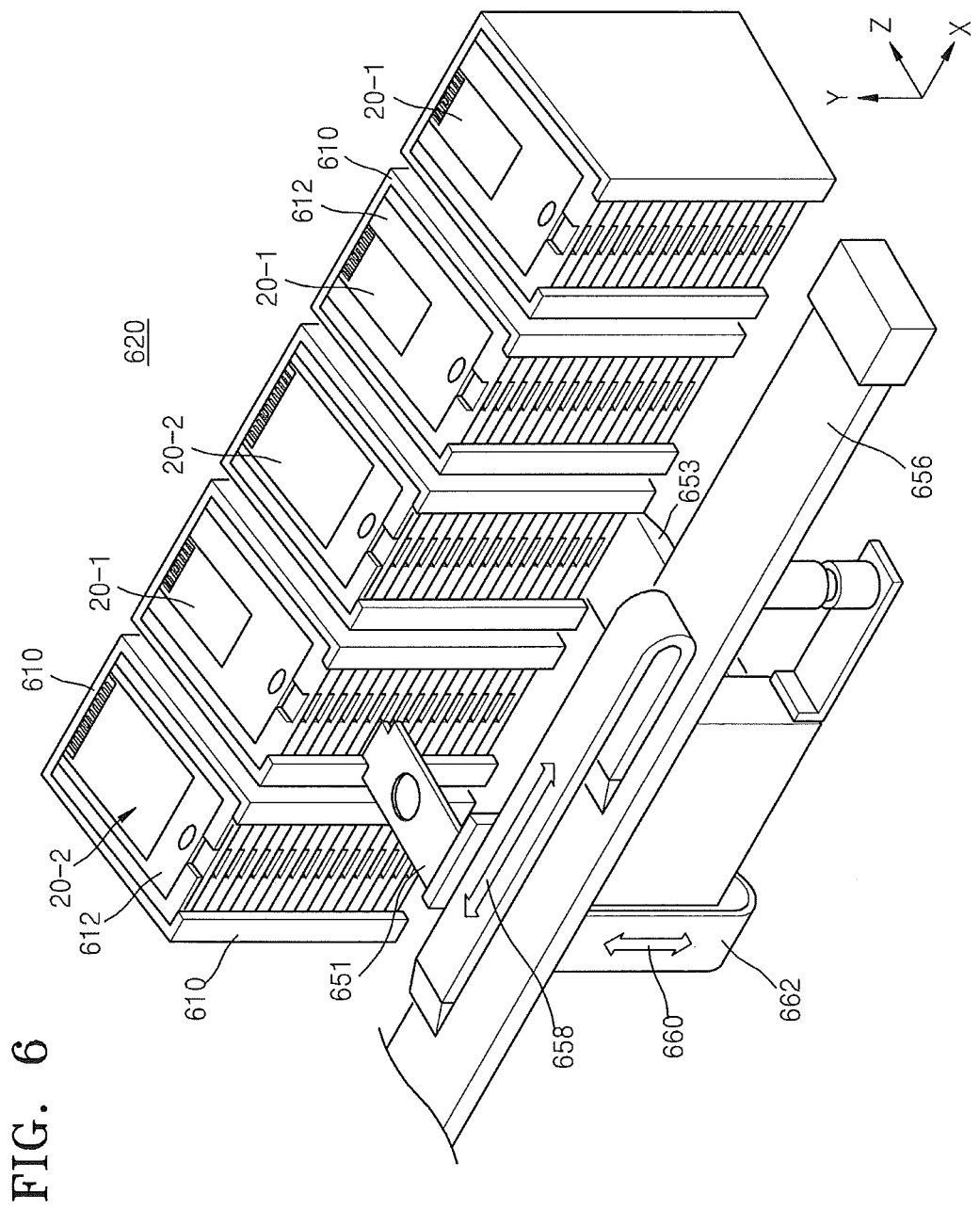
FIG. 6 is a perspective view of a test kit stack part, according to an embodiment of the inventive concept.
Figure 7:
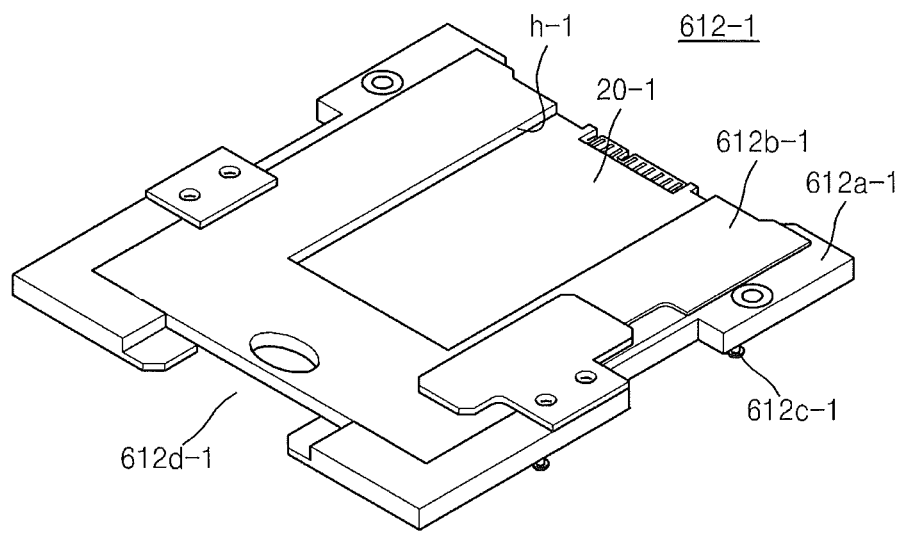
FIGS. 7 and 8 are perspective views of test kits mounted on the test kit stack part of FIG. 6, according to an embodiment of the inventive concept.
Figure 8:
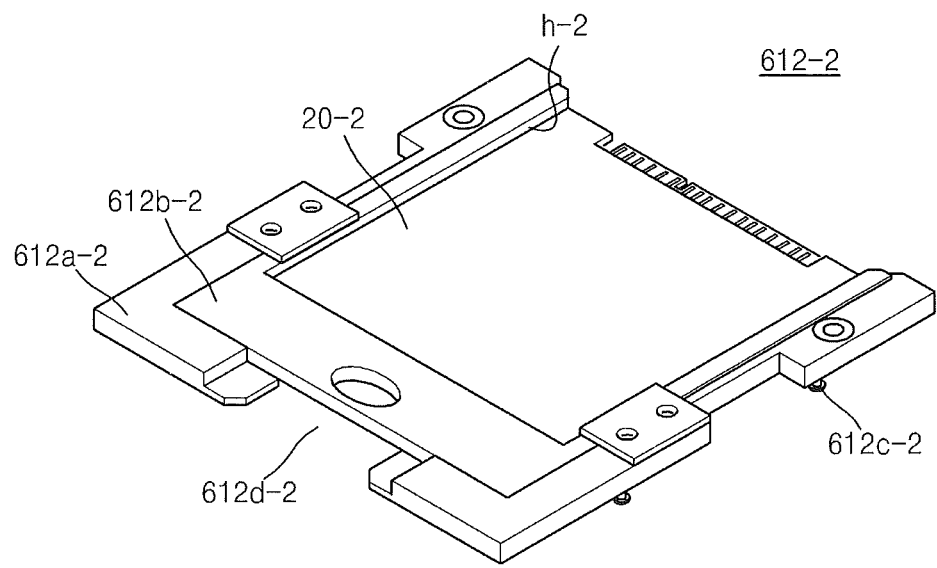

FIG. 6 is a perspective view of the test kit stack part 620, and FIGS. 7 and 8 are perspective views of the test kits 612 mounted on the test kit stack part 620.

In more detail, FIG. 6 illustrates an embodiment of the test kit stack part 620 of FIG. 5, and FIGS. 7 and 8 illustrate embodiments of the test kits 612 mounted on the test kit stack part 620. The test kit stack part 620 may include a plurality of test kit stack units 610. A plurality of test kits 612 may be mounted on each of the test kit stack units 610. The SSDs 20 may be mounted on respective test kits 612. As illustrated in FIGS. 6 to 8, the test kit stack units 610 include the test kits 612-1 and 612-2, and thus different types of SSDs 20-1 and 20-2 may be mounted on the test kits.

The test kit stack part 620 includes third transportation robots 651 and 656 for transporting the test kits 612 between (e.g., to and from) the test kit stack units 610. The third transportation robots 651 and 656 may include a hand unit 651 for supporting the test kits 612, and a transportation supporting apparatus 656 for supporting and moving the hand unit 651 in the X axis direction (e.g., direction 658 shown in FIG. 6).

The test kit stack units 620 may include fourth transportation robots 653 and 652 for vertically lifting the test kits 612 mounted on the test kit stack units 610. The fourth transportation robots 653 and 652 may include a lifter 653 for lifting the test kits 612 in the Z axis direction (e.g., direction 660 shown in FIG. 6), and a transportation supporting apparatus 662 for supporting the lifter 653. When the test kits 612 are lifted by the lifter 653, the test kits 612 may be transported by the gripper 636*a* of FIG. 9 of the first transportation robots 632, 634 and 636.

The third transportation robots 651 and 656, and the fourth transportation robots 653 and 662 may be operated by a cylinder.

The test kits 612 are illustrated in FIGS. 7 and 8 as examples. The test kit 612-1 of FIG. 7 has a narrow SSD 20-1. In FIG. 8, the test kit 612-2 has a wider SSD 20-2 than the SSD 20-1 of FIG. 7.

The test kits 612-1 and 612-2 include: SSD mounting parts 612*b*-1 and 612*b*-2 having internal grooves h-1 and h-2 in which the SSDs 20-1 and 20-2 are mounted; and kit base parts 612*a*-1 and 612*a*-2 having internal penetration parts or portions 612*d*-1 and 612*d*-2 in which the SSD mounting parts 612*b*-1 and 612*b*-2 are mounted.

The test kits 612-1 and 612-2 may include protrusions 612*c*-1 and 612*c*-2 that may be fixed to the test kit fixing support 622 of FIG. 5, as will be described below. The protrusions 612*c*-1 and 612*c*-2 may be inserted into grooves 670 of FIGS. 12 and 13 formed in the test kit fixing support 622 of FIG. 5, and may protect or help prevent the test kits 612 from shaking or vibrating when the SSDs 20 are tested.

Figure 9:
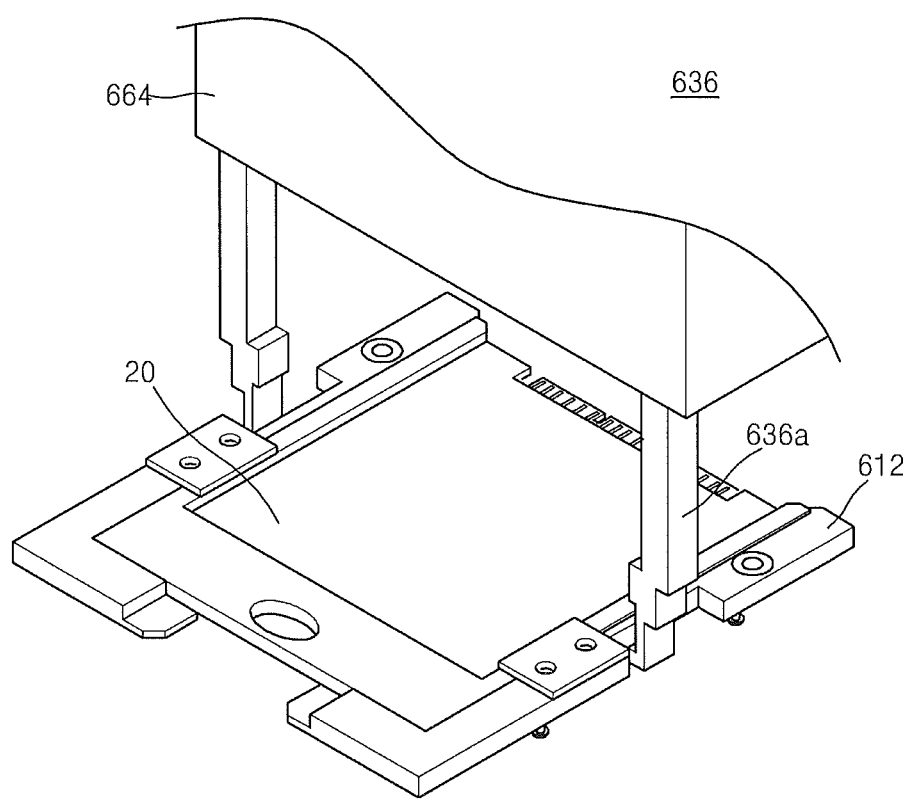
FIGS. 9 and 10 are perspective views of transportation robots of the test handler apparatuses, according to an embodiment of the inventive concept.
Figure 10:
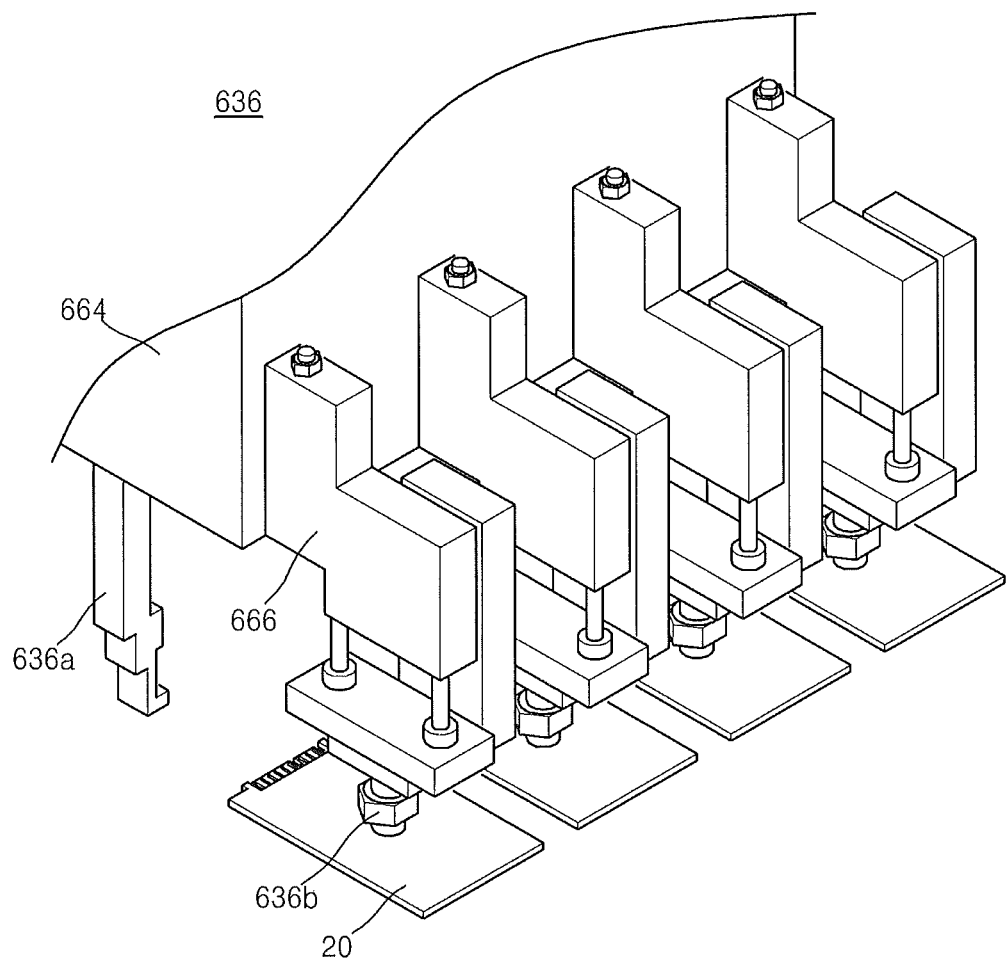

FIGS. 9 and 10 are perspective views of the transportation robots of the test handler apparatus 600*a* and 600*b*, according to an embodiment of the inventive concept.

In more detail, FIGS. 9 and 10 illustrate an embodiment of the picker and the gripper 636 of the first transportation robots 632, 634 and 636. As described above, the first transportation robots 632, 634 and 636 include both the picker and the gripper 636 for simultaneously transporting the test kits 612 and the SSDs 20.

In FIG. 9, the gripper 636*a* for transporting the test kits 612, on which the SSDs 20 are mounted, is illustrated. The gripper 636*a* may hold both ends (e.g., opposite sides) of the test kits 612 for transportation. Supporting members 664 for supporting the gripper 636 may be connected to the gripper 636*a*.

FIG. 10 illustrates the picker 636*b* for transporting the SSDs 20. The picker 636*b* may transport the SSDs 20 using air absorption or suction. The picker 636*b* may be connected to the supporting members 664 and a cylinder 666 may be installed on the picker 636*b*.

Figure 11:
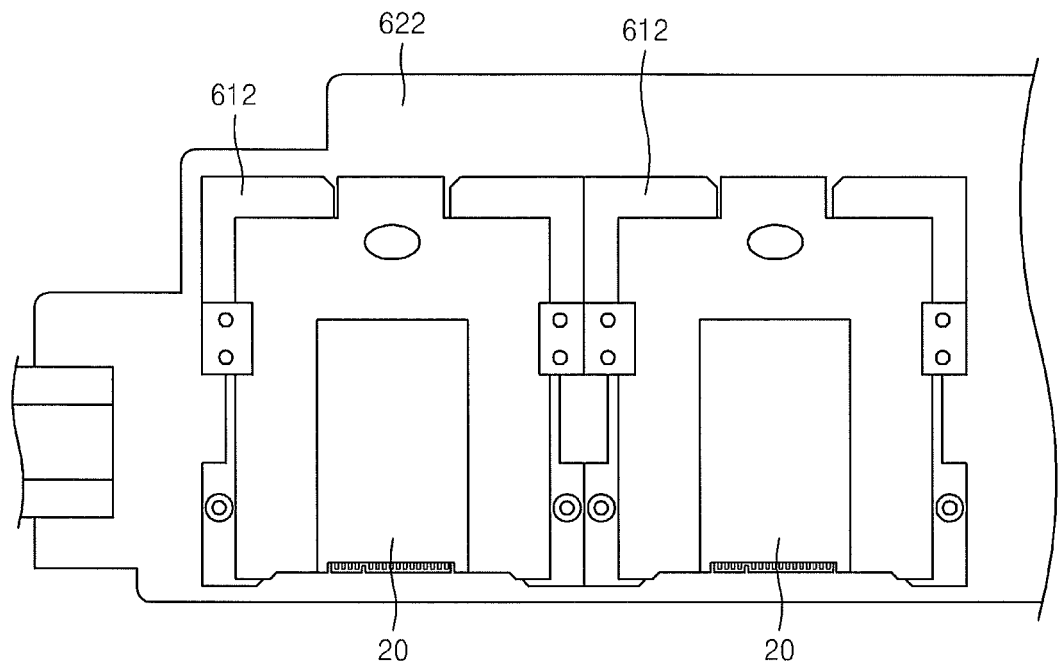
FIGS. 11 and 12 are top and back views, respectively, of a test kit fixing support, according to an embodiment of the inventive concept.
Figure 12:
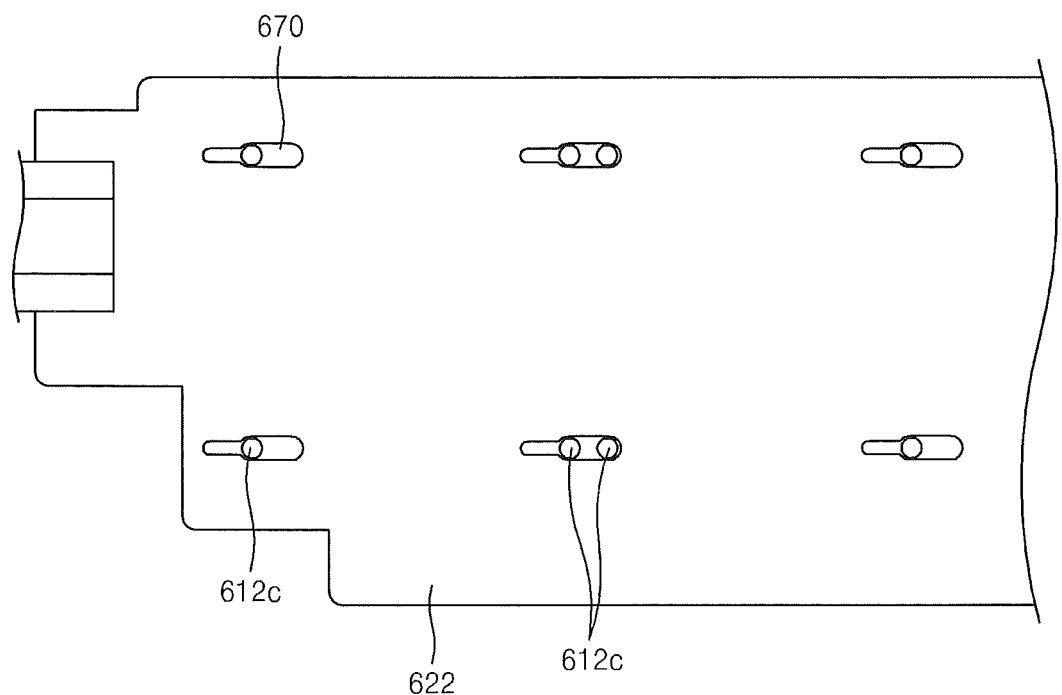
Figure 13A:
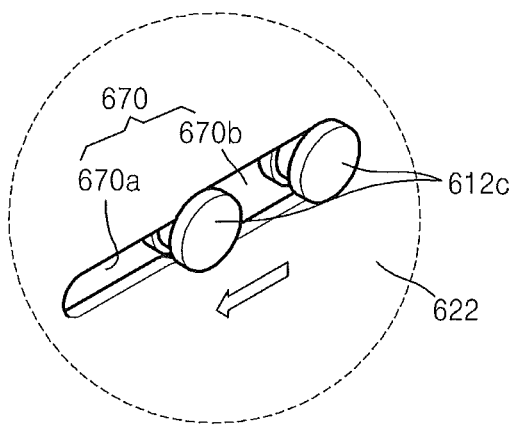
FIGS. 13A and 13B are schematic views of a method of fixing the test kit fixing support to the test kit of FIGS. 11 and 12, according to an embodiment of the inventive concept.
Figure 13B:
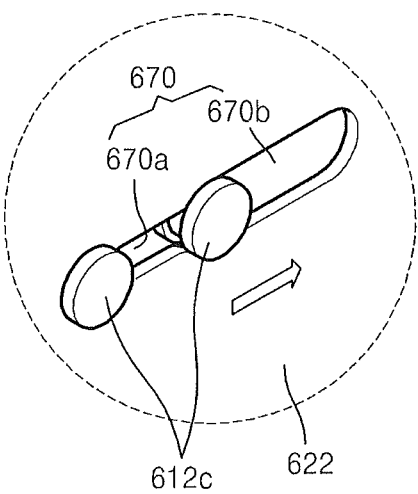

FIGS. 11 and 12 are top and back views of the test kit fixing support 622, and FIGS. 13A and 13B are schematic views illustrating a method of fixing a test kit 612 to the test kit fixing support 622.

In more detail, FIG. 11 is a top view illustrating a state in which the test kits 612 are mounted on the test kit fixing support 622 of FIG. 5. FIG. 12 is a back view illustrating a state in which the test kits 612 are mounted on the test kit fixing support 622 of FIG. 5.

As described above, the test kits 612 may be mounted on the test kit fixing support 622 by the first transportation robots 632, 634 and 636 of FIG. 5. The test kit fixing support 622 has the grooves 670 in which the protrusions 612*c* of the test kits 612 are inserted. The grooves 670 may have narrow and wide parts or portions as illustrated in FIGS. 12, 13*a* and 13*b*. When the test kits 612 are mounted on the test kit fixing support 622, the protrusions 612*c* protruding from the bottom of the test kits 612 may be inserted into the grooves 670 formed in the test kit fixing support 622 and fixed in the grooves 670.

Referring to FIG. 13A, the protrusions 612*c* protruding from the bottom of the test kits 612 are inserted into the grooves 670 formed in the test kit fixing support 622, and then the protrusions 612c are moved into narrow portions 670a of the grooves 670. When the protrusions 612c of the test kits 612 are moved into the narrow groove portions 670a, the test kits 612 are fixed to the test kit fixing support 622. A test process may be performed after the test kits 612 are fixed to the test kit fixing support 622.

Referring to FIG. 13b, the protrusions 612c protruding from the bottom of the test kits 612 are inserted into the grooves 670 at the wide portions 670b of the grooves 670. When the protrusions 612c of the test kits 612 are moved into the wide groove portions 670b, the test kits 612 are not fixed to the test kit fixing support 622. After the test process is performed, the test kits 612 may be moved such that the protrusions 612c are at the wide groove portions 670b and the test kits 612 may be unfastened from the test kit fixing support 622.

Figure 14:
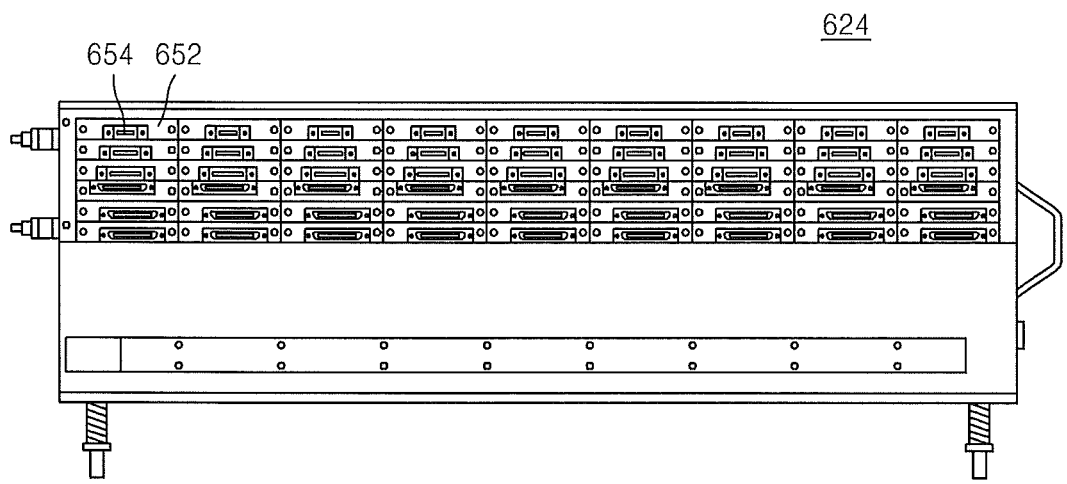
FIG. 14 is a side view of a test board, according to an embodiment of the inventive concept.
Figure 15:
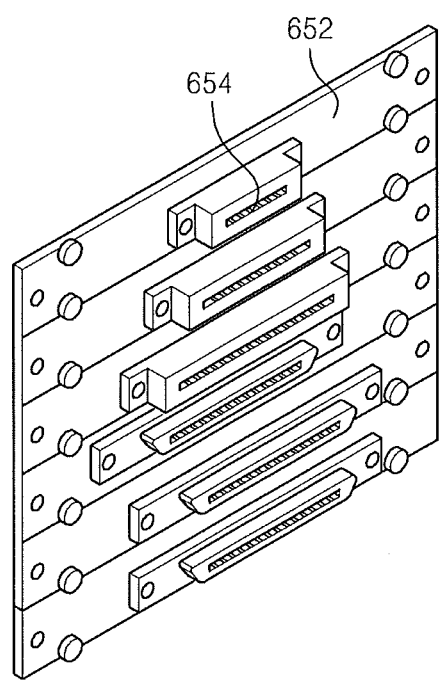
FIG. 15 is a side view of an enlarged socket on the test board of FIG. 14, according to an embodiment of the inventive concept.
Figure 16:
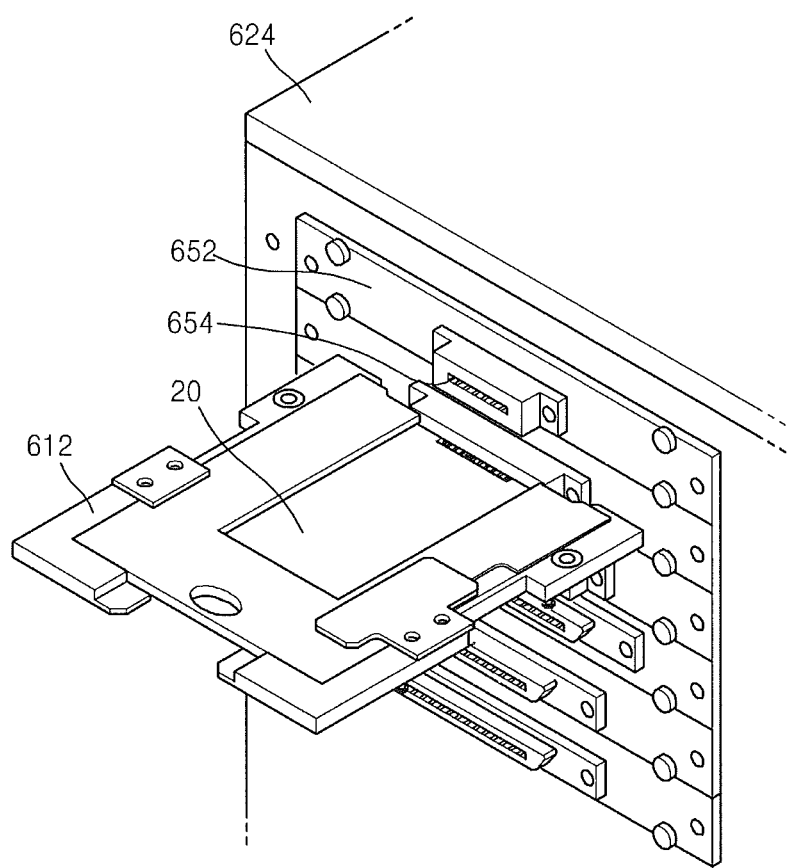
FIG. 16 is a perspective view illustrating connection of a socket on the test board with a test kit, according to an embodiment of the inventive concept.

FIG. 14 is a side view of the test board 624, FIG. 15 is a side view of sockets of the test board 624, and FIG. 16 is a perspective view illustrating connection of a socket 654 of the test board 624 with a test kit 612.

In more detail, FIG. 14 may be an embodiment of the test board 624 that may be used in the test site units 630a and 630b of FIG. 5. A plurality of unit socket groups 652 may be installed on the test board 624. Various types and sizes of sockets 654 may be installed on the unit socket groups 652. In other words, as illustrated in FIGS. 14 and 15, diverse sockets 654 may be installed on the test board 624 to correspond to the various types or sizes of the SSDs 20. The sockets 654 may have different sizes or numbers of pins, and may be installed to correspond to the number of pins or the sizes of the SSDs 20 mounted on the test kits 612.

FIG. 16 illustrates connection of the test kits 612 on which the SSDs 20 are mounted with the test board 624 installed in the test site units 630a and 630b. A test process may be implemented when the sockets 654 installed on the test board 624 and the SSDs 20 mounted on the test kits 612 are electrically connected.

FIGS. 17 to 20 are cross-sectional views illustrating a connection process of the test board 624 and the test kits 612 on which the SSDs 20 are mounted.

In more detail, FIGS. 17 to 20 are cross-sectional views illustrating an embodiment of the connection process of the test kits 612 on which the SSDs 20 are mounted and the test board 624 of FIGS. 14 and 15 through the test kit stack part 620 and the test site units 630a and 630b of FIG. 5.

Figure 17:
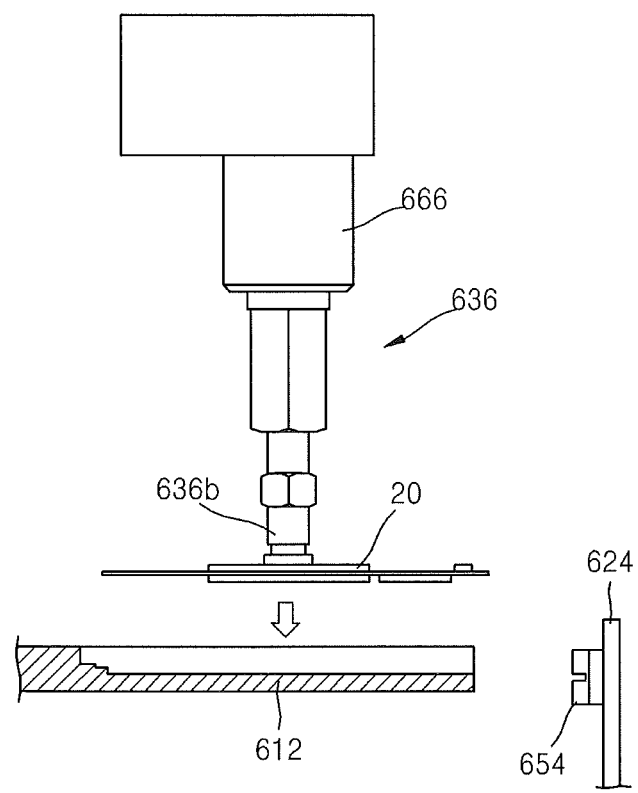
FIGS. 17 through 20 are cross-sectional views illustrating a connection process of a test kit on which a SSD is mounted and a test board, according to an embodiment of the inventive concept.

As illustrated in FIG. 17, the SSDs 20 are mounted on the test kits 612 disposed on the test kit stack part 620 by using the picker 636b of the first transportation robots 632, 634 and 636.

Figure 18:
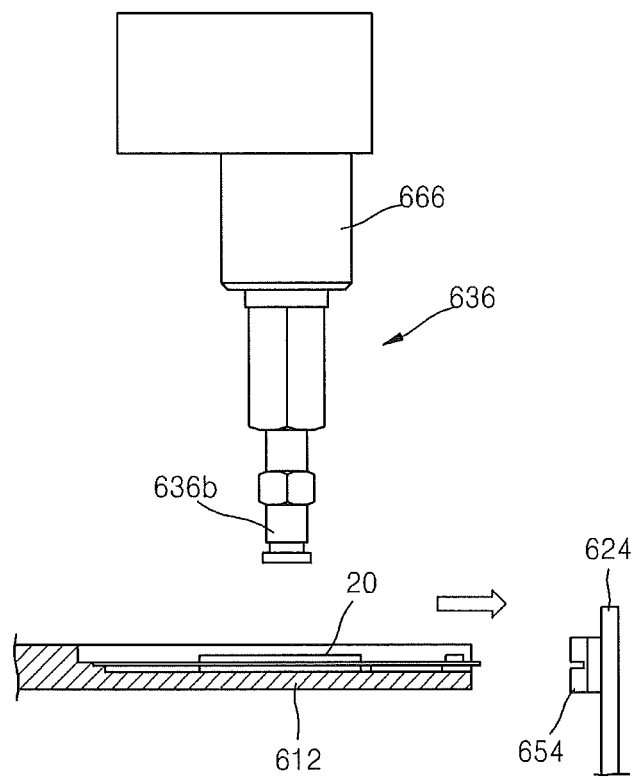

After transporting the test kits 612 on which the SSDs 20 are mounted to the test site units 630a and 630b of FIG. 5 and moving the test kit fixing support 622, the test kits 612 on which the SSDs 20 are mounted may move towards the sockets 654 of the test board 624, as shown by the arrow in FIG. 18.

Figure 19:
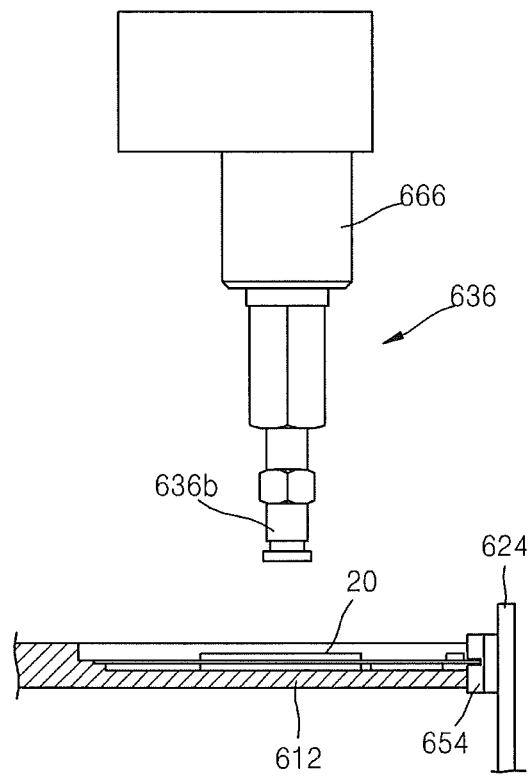
Figure 20:
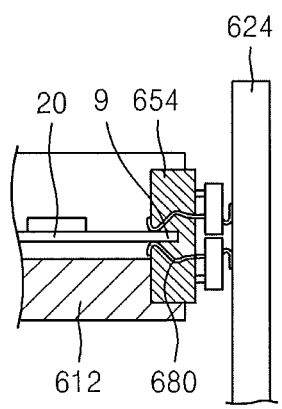

As illustrated in FIG. 19, the SSDs 20 mounted on the test kits 612 may be electrically connected to the sockets 654 of the test board 624. FIG. 20 is an enlarged view illustrating electrical connection of the SSDs 20 with the sockets 654 of the test board 624 of FIG. 19. As shown in FIG. 20, a connector 680 associated with the socket 654 of the test board 624 may be connected to a connector 9 of the SSD 20 so that a test process may be implemented.

While the inventive concept has been particularly shown and described with reference to exemplary embodiments thereof, it will be understood that various changes in form and details may be made therein without departing from the spirit and scope of the following claims.

What is claimed is:

1. An automatic module apparatus for manufacturing a solid state drive (SSD), the apparatus comprising:
   a SSD labeling apparatus configured to print a label on each of a plurality of SSDs mounted on a carrier tray;
   one or more test handler apparatuses, each test handler apparatus configured to receive the carrier tray on which the labeled SSDs are mounted from the SSD labeling apparatus and to test the labeled SSDs to determine whether the labeled SSDs are defective or non-defective; and
   a first SSD sorting apparatus configured to receive the carrier tray on which the tested SSDs are mounted from the one or more test handler apparatuses and to sort non-defective defective SSDs as tested by the test handler apparatuses,
   wherein the SSD labeling apparatus, the test handler apparatuses, and the first SSD sorting apparatus are in-line with the SSD labeling apparatus in front of the test handler apparatuses and the test handler apparatuses in front of the first SSD sorting apparatus, and
   wherein the SSD labeling apparatus, the test handler apparatuses, and the first SSD sorting apparatus are automated such that the carrier tray is transported in a straight line from the SSD labeling apparatus to the test handler apparatuses and from the test handler apparatuses to the first SSD sorting apparatus,
   wherein the carrier tray is transported by a tray transportation apparatus installed in the SSD labeling apparatus, the test handler apparatuses, and the first SSD sorting apparatus, the tray transportation apparatus comprising a straight continuous conveyor member to transport the carrier tray in the straight line from the SSD labeling apparatus to the test handler apparatuses and from the test handler apparatuses to the first SSD sorting apparatus.

2. The apparatus of claim 1, wherein at least one tray rotation member configured to rotate the carrier tray is installed in the straight conveyor member of the tray transportation apparatus at each test handler apparatus to align a connector of a respective SSD on the carrier tray with a socket of a test board of the test handler apparatus.

3. The apparatus of claim 1, further comprising a SSD casing apparatus configured to assemble cases on each of the SSDs mounted on the carrier tray, the SSD casing apparatus installed in front of the SSD labeling apparatus.

4. The apparatus of claim 3, further comprising a router apparatus and a second SSD sorting apparatus, the second SSD sorting apparatus configured to sort defective bare SSDs from non-defective bare SSDs manufactured by the router apparatus, wherein the router apparatus and the second SSD sorting apparatus are installed in front of the SSD casing apparatus.

5. The apparatus of claim 1, further comprising a visual inspection apparatus configured to inspect an exterior of each of the SSDs mounted on the carrier tray, wherein the first SSD sorting apparatus is installed in front of the visual inspection apparatus.

6. The apparatus of claim 1, further comprising a visual inspection apparatus disposed between the one or more test handler apparatuses and the first SSD sorting apparatus, the visual inspection apparatus configured to inspect an exterior of each of the SSDs mounted on the carrier tray.

7. The apparatus of claim 1, further comprising a router apparatus and a second SSD sorting apparatus, the second SSD sorting apparatus configured to sort defective bare SSDs from non-defective bare SSDs provided by the router apparatus, wherein the router apparatus and the second SSD sorting apparatus are installed in front of the SSD labeling apparatus.

8. An automatic module apparatus for manufacturing a SSD, the apparatus comprising:
a tray loading apparatus configured to provide a carrier tray on which a plurality of SSDs are mounted;
a tray transportation apparatus configured to receive and to transport the carrier tray on which the SSDs are mounted; and
one or more test handler apparatuses configured to test electrical characteristics of the SSDs mounted on the carrier tray, wherein the tray transportation apparatus extends through each of the test handler apparatuses such that the carrier tray is conveyed through each of the test handler apparatuses;
wherein each test handler apparatus comprises:
a test kit stack part comprising a plurality of test kit stack units, the test kit stack part configured to receive the SSDs that have been removed from the carrier tray such that each SSD is mounted on an individual test kit and such that a plurality of the test kits are mounted on each of the test kit stack units in a stacked relationship to one another; and
a test site unit configured to receive the test kits from the test kit stack part and to test electrical characteristics of the SSDs mounted on the test kits.

9. The apparatus of claim 8, further comprising a transportation robot configured to transport the test kits from the test kit stack units to the test site unit.

10. The apparatus of claim 8, wherein each test handler apparatus comprises a transportation robot configured to transport the SSDs from the carrier tray to the test kit stack part, the transportation robot further configured to transport the test kits to the test site unit.

11. The apparatus of claim 10, wherein the transportation robot comprises:
a picker configured to mount the SSDs on respective test kits; and
a gripper configured to transport the test kits to the test site unit.

12. The apparatus of claim 8, wherein the test site unit comprises:
a test kit fixing support on which the test kits are fixedly mounted; and
a test board configured to electrically connect to the SSDs mounted on the test kits.

13. The apparatus of claim 12, wherein each test kit includes one or more protrusions at a bottom portion thereof, wherein the test kit fixing support includes one or more grooves sized and configured to receive the one or more protrusions such that the test kit is fixedly mounted to the test kit fixing support.

14. The apparatus of claim 13, wherein a respective groove has a wide portion and a narrow portion extending from the wide portion, and wherein the groove is configured to receive a respective protrusion first in the wide portion of the groove and then in the narrow portion of the groove to fixedly mount the test kit to the test kit fixing support.

15. The apparatus of claim 12, wherein a plurality of unit socket groups for electrical connection with the SSDs mounted on the test kits are installed on the test board, and wherein each unit socket group includes a plurality of differently configured sockets for electrical connection with differently configured SSDs.

16. The apparatus of claim 8 wherein a respective test kit comprises a groove defined therein, the groove sized and configured to receive one of the SSDs.

17. The apparatus of claim 16 wherein, when the SSD is received in the groove, the test kit covers at least a portion of each of opposite upper and lower surfaces of the SSD.

18. An automatic module apparatus for manufacturing a SSD, the apparatus comprising:
a tray transportation apparatus configured to transport a carrier tray on which a plurality of SSDs are mounted; and
a test handler apparatus through which the tray transportation apparatus extends, the test handler apparatus comprising:
a test kit stack part having a plurality of test kits thereon;
a test site unit having a plurality of sockets, each socket configured to electrically connect with an SSD; and
at least one transportation robot configured to:
remove each SSD from the carrier tray and mount the SSD on one of the test kits on the test kit stack part; and
transport each test kit with the SSD mounted thereon to the test site unit,
wherein the test site unit includes a test kit fixing support, and wherein the at least one transportation robot is configured to mount the test kits to the test kit fixing support, and
wherein each test kit comprises a protrusion at a bottom portion thereof, wherein the test kit fixing support comprises a groove having a wide portion and a narrow portion extending from the wide portion, and wherein the at least one transportation robot is configured to mount the test kit to the test kit fixing support such that the protrusion is first received in the wide portion of the groove and then received in the narrow portion of the groove to fixedly mount the test kit to the test kit fixing support.

19. The apparatus of claim 18, wherein the test kit fixing support is configured to move toward the sockets such that a connector of one of the SSDs is received in one of the sockets to electrically connect the SSD and the socket.

20. The apparatus of claim 18, wherein:
the test handler apparatus is configured to determine whether each SSD is defective or non-defective based on an electrical test;
the at least one transportation robot is configured to transport the SSDs that are determined to be non-defective to the carrier tray; and
the tray transportation apparatus is configured to transport the carrier tray having the non-defective SSDs away from the test handler apparatus.

* * * * *